United States Patent [19]

Sato

[11] Patent Number: 5,657,272

[45] Date of Patent: Aug. 12, 1997

[54] NON-VOLATILE SEMICONDUCTOR MEMORY AND DATA ERASING METHOD FOR THE SAME

[75] Inventor: Toshiya Sato, Tokyo, Japan

[73] Assignee: NEC Corporation, Japan

[21] Appl. No.: 617,289

[22] Filed: Mar. 18, 1996

[30] Foreign Application Priority Data

Mar. 17, 1995 [JP] Japan ..................................... 7-057840

[51] Int. Cl.$^6$ ................................................. G11C 11/34
[52] U.S. Cl. ...................................... 365/185.3; 365/218
[58] Field of Search ........................ 365/185.29, 185.3, 365/218, 185.01

[56] References Cited

U.S. PATENT DOCUMENTS 5,508,959  4/1996  Lee et al. ............................. 365/185.3

FOREIGN PATENT DOCUMENTS 4-222994  12/1990  Japan .

Primary Examiner—David C. Nelms
Assistant Examiner—F. Niranjan
Attorney, Agent, or Firm—Ostrolenk, Faber, Gerb & Soffen, LLP

[57] ABSTRACT

The non-volatile semiconductor memory disclosed includes an X-decoder and word line potential supply circuits, and a current setting/holding circuit. The X-decoder and the word line potential supply circuits set all word lines ground potential in the flash erasing operation, to a predetermined first over-erasing judgment reference potential in an "on" cell detecting operation, and to a predetermined second over-erasing judgment reference potential for judgment of over-erasing deeper than the first over-erasing judgment reference potential and, in an "on" cell specifying operation, set predetermined selected word lines to the first over-erasing judgment reference potential while setting other word lines than the selected word line to the second over-erasing judgment reference potential. The current setting/holding circuit sets the reference current in an "on" cell specifying reference current setting operation such that the result of the check by a sense amplifier is "on". It is possible to eliminate the possibility of generation of a memory cell transistor in a non-erased state, thus ensuring quick operation.

6 Claims, 5 Drawing Sheets

NON-VOLATILE SEMICONDUCTOR MEMORY AND DATA ERASING METHOD FOR THE SAME

BACKGROUND OF THE INVENTION (1) Field of the Invention

The present invention relates to non-volatile semiconductor memories and a data erasing method for the same, and more particularly to a non-volatile semiconductor memory which comprises memory cells constituted by field-effect transistors capable of setting electrical threshold voltage and is capable of making flash erasing, and a data erasing method for the same.

(2) Description of the Related Art

Non-volatile semiconductor memories, which comprise an array of a plurality of memory cell transistors constituting memory cells and capable of electrically setting threshold voltage setting, such as field-effect transistors with floating gates, have been attracting attention as flash memories capable of making electrical flash erasing of data.

An example of such non-volatile semiconductor memory is shown in FIG. 1.

This non-volatile semiconductor memory comprises a memory cell array 1, a plurality of word lines WL1 to WLm, a plurality of digit lines DL1 to DLn, a source line SL, a source potential supply circuit 6, an X-decoder 2 and a word line potential supply circuit 3x, a Y-decoder 4 and a Y-selector 5, a sense amplifier 8, a reference current generator 9, and a drain potential supply circuit 7.

The memory cell array 1 includes a plurality of memory cell transistors MC11 to MCmn arranged in rows and columns. Each memory cell transistor is a field-effect transistor having a floating gate and capable of electrically setting a threshold voltage. Each of the word lines WL1 to WLm is provided for each row of the array of memory cell transistors MC11 to MCmn and connected to the control gate of each of the memory cell transistors in the corresponding row. Each of the digit lines DL1 to DLn is provided for each column of the array of memory cell transistors MC11 to MCmn and connected to the drain of each of the memory cell transistors in the corresponding column. The source line SL is connected to the source of each of the memory cell transistors MC11 to MCmn. The source potential supply circuit 6 is operable according to an erasing control signal ER such that it supplies a predetermined erasing voltage Ve to the source line SL at the time of flash erasing operation and that it holds the source line SL at ground potential when the flash erasing operation is not taking place. The X-decoder 2x and word line potential supply circuit 3x operate together according to control signals AXS, AXN and VX and an address signal ADX so as to select one of the word lines WL1 to WLm to be held at a selected level, i.e., the level of supply potential Vcc in normal read operation, hold all word lines WL1 to WLm at the ground potential level in the flash erasing operation and select one word line to be held at a write voltage Vx in write operation. The Y-decoder 4 and Y-selector 5 operate together according to control signals AYN and AYS and an address signal ADY so as to select one of the digit lines DL1 to DLn in the normal read and write operations and bring all the digit lines DL1 to DLn to be in a non-selective floating state in the flash erasing operation. The sense amplifier 8 compares, in the read operation, the current flowing in the digit line selected by the Y-decoder 4 and Y-selector 5 with a reference current Ir to check whether a selected memory cell transistor connected to the selected digit line is "on" (so that the selected digit line current is higher than the reference current Ir) or "off". The drain potential supply circuit 7 supplies a predetermined write potential to the digit line selected by the Y-decoder 4 and Y-selector 5.

In this non-volatile semiconductor memory, the X-decoder 2x includes an inverter IV21 corresponding to each bit of the X-address signal ADX, and NAND type logical gates G21 and G22, a NAND type logical gate G23 corresponding to each word line, and transistors Q21 to Q23. The Y-decoder 4 has a structure similar to that of the X-decoder 2x. The Y-selector 5 includes transistors Q51 to Q5n which receive the output signals of the Y-decoder 4 respectively at their gates. The sense amplifier 8 is of a current comparator type including inverters IV81 and IV82 and transistors Q81 and Q88.

The operation of this non-volatile semiconductor memory will now be described.

In the normal write operation, the control signals AXS and AXN are set to high level to select one word line according to the X-address signal ADX and supply the write voltage Vx to the selected word line from the word line potential supply circuit 3x. Also, the control signals AYS and AYN are set to high level to select one digit line according to the Y-address signal and supply a write voltage Vp to the selected digit line from the write drain potential supply circuit 7. At this time, the source line SL is held at ground potential by the source potential supply circuit 6. As a result, the predetermined write voltages Vx and Vp are applied to the control gate and drain of the memory cell transistor which is connected to the selected word line and the selected digit line to increase the threshold voltage of this memory cell transistor. For example, the threshold voltage is increased beyond the supply potential Vcc, when the control gate potential is made Vcc in the read operation.

In the read operation, one word line is selected according to the X-address signal ADX to be held at a selected level, i.e., the supply potential Vcc. Also, one digit line is selected according to the Y-address signal ADY to be connected to the sense amplifier 8. The sense amplifier 8 compares the current flowing in the selected digit line with the reference current Ir. When the selected memory cell transistor is in the write state, its threshold voltage is higher than the selected level (Vcc) of the selected word line. In this case, no drain current of the selected memory cell transistor flows, that is, no current is caused to flow to the selected digit line. The sense amplifier 8 thus determines that this memory cell transistor is "off". When the selected memory cell transistor is in an erasing state, its threshold voltage is lower than the selected level of the selected word line, and its drain current is higher than the reference current Ir. The sense amplifier 8 thus determines that this memory cell transistor is "on".

In the erase operation, the control signal AXN is set to a low level to turn on the transistors Q23 so as to hold all the word lines WL1 to WLm at the ground potential. Also, the control signal AYN is set to a low level to turn off all the transistors Q51 to Q5n so as to hold all the digit lines DL1 to DLn in the non-selective state, i.e., the floating state. In this state, the erasing voltage Ve of a predetermined high potential, is supplied to the source line SL from the source potential supply circuit 6. As a result, the threshold voltage of all the memory cell transistors MC11 to MCmn becomes lower than a predetermined voltage resulting in the flash erasing state.

Such flash erasing is subject to fluctuations of its progress speed due to such causes as memory cell transistor gate insulating film thickness fluctuations. The flash erasing operation, therefore, may result in the generation of some over-erased memory cell transistors. The over-erased memory cell transistor is such that it is turned on (with its threshold voltage becoming negative) although its word line is at the non-selected level (for instance, a ground potential). In such a case, the digit line to which the over-erased memory cell transistor is connected, carries an "on" cell current at all times to disable normal data reading.

Accordingly, in this non-volatile semiconductor memory, after the end of the flash erasing operation all the digit lines DL1 to DLn are selected by setting the control signals to AYS and AYN to low and high levels, respectively, while setting all the word lines WL1 to WLm to the non-selected level, i.e., ground potential level, by setting the control signal AYN to low level, and the currents in all the digit lines DL1 to DLn are compared to the reference current Ir to check whether the memory cell transistors MC11 to MCmn include even a single "on" state memory cell transistor (over-erased cell). When even a single "on" state memory cell transistor is detected, shallower writing than the normal writing, that is, writing to obtain a smaller memory cell transistor threshold voltage change than in the normal writing, is done with respect to all the memory cell transistors MC11 to MCmn, thus restoring the over-erased memory cell transistor or transistors to the normal erased state (as disclosed, for instance, in Japanese Patent Application Kokai Publication No. Hei 4-222994).

In the above case, all the digit lines DL1 to DLn are selected and checked for any "on" state (or over-erased) memory cell transistors MC11 to MCmn. Instead, it is possible to adopt a digit line unit detection method, in which a single digit line is selected according to the Y-address signal ADY by setting both the control signals AYS and AYN to high level to check for any "on" one or ones among the memory cell transistors connected to the selected digit line.

In the prior art non-volatile semiconductor memory described above, after the flash erasing operation, a check is made, by selecting all the digit lines or a single digit line, for any over-erased memory cell transistor connected to any of the selected digit lines or to the single selected digit line and, when an over-erased memory cell transistor is detected, shallow writing compared to the normal writing is done with respect to the memory cell transistors connected to all the digit lines or to the single selected digit line. By doing the shallow writing, the over-erased memory cell transistor can be restored to the normal erased state. However, some memory cell transistors, to which the shallow writing has been done, may be found in the vicinity of a criteria for the judgment of the erased state. These memory cell transistors may go beyond the criteria to be in the non-erased state. To preclude this possibility, it is necessary to check the erased state again, and when a memory cell transistor in the non-erased state is detected, it is necessary to repeat operation from the flash erasing. This means extra time is required until all the memory cell transistors are restored to the normal erased state.

Besides, even when no memory cell transistor in the non-erased state is detected as a result of the confirmation of the erased state after the shallow writing, the shallow writing increases the threshold voltage of all the memory cell transistors, thus reducing the drain current in the read operation so as to reduce the speed thereof.

SUMMARY OF THE INVENTION

An object of the present invention, therefore, is to overcome the problems existing in the prior art, and to provide a non-volatile semiconductor memory, in which any over-erased memory cell transistor after flash erasing is restored to the normal erased state through shallow writing done with respect to the over-erased memory cell transistor, and which can prevent normally erased memory cell transistors from being brought to the non-erased state, as well as reducing the time required until all the memory cell transistors reach the normal erased state and also suppress reduction of the drain current in the memory cell transistors in the read operation to prevent speed reduction thereof.

According to one aspect of the invention, there is provided a non-volatile semiconductor memory comprising:

a memory cell array including a plurality of field-effect transistors capable of making electrical threshold voltage setting, the field-effect transistors serving as memory cell transistors arranged as memory cells in rows and columns;

a plurality of word lines each provided for each row of the memory cell array and connected to a control gate of each of the memory cell transistors of a corresponding one of the rows;

a plurality of digit lines each provided for each column of the memory cell array and connected to a drain of each of the memory cell transistors of a corresponding one of the columns;

a source line connected to a source of each of the memory cell transistors;

a source potential supply circuit for applying a predetermined erasing voltage to the source line when a flash erasing operation is performed, while holding the source line at ground potential when the flash erasing operation is not taking place;

a word line selecting means and word line potential supply means for setting all the word lines to ground potential in the flash erasing operation, to a predetermined first over-erasing judgment reference potential in an "on" cell detecting operation and to a predetermined second over-erasing judgment reference potential for judgment of over-erasing deeper than the first over-erasing judgment reference potential and in an "on" cell specifying reference current setting operation, in an "on" cell specifying operation, setting a predetermined selected one of the word lines to the first over-erasing judgment reference potential while setting the other word lines than the selected word line to the second over-erasing judgment reference potential;

a digit line selecting means for setting all the digit lines to a non-selective floating state in the flash erasing operation and selecting one predetermined digit line out of the digit lines when the flash erasing operation is not taking place;

a sense amplifier for checking whether the memory cell transistors connected to the digit line selected by the digit line selecting means are "on" or "off" by comparison of a current flowing through the selected digit line with a reference current;

a reference current generator for generating the reference current for a normal read operation and supplying the generated reference current to the sense amplifier in the normal read operation and also in an "on" cell detecting operation;

a current setting/holding circuit for setting the reference current in the "on" cell specifying reference current setting operation such that the result of the check by the sense amplifier is "on", holding the reference current and supplying to the sense amplifier in the "on" cell specifying operation; and a writing means for making shallow writing shallower than a normal writing in memory cell transistors determined to be "on" by the sense amplifier in the "on" cell specifying operation.

According to another aspect of the invention, there is provided a method of erasing data in a non-volatile semiconductor memory comprising a memory cell array including a plurality of field-effect transistors capable of making electrical threshold voltage setting, the field-effect transistors serving as memory cell transistors arranged as memory cells in rows and columns, word lines each provided for each row of the memory cell array and connected to a control gate of each of the corresponding memory cell transistors, digit lines each provided for each column of the memory cell array and connected to a drain of each of the corresponding memory cell transistors, and a source line connected to a source of each of the corresponding memory cell transistors, the method comprising:

a flash erasing step for flash erasing data in all of the memory cell transistors by supplying a predetermined erasing voltage to the source line while holding all of the word lines at ground potential and holding all of the digit lines in a non-selective state;

an "on" cell detection step for setting all of the word lines to a first over-erasing judgment reference potential for predetermined over-erasing judgment, selecting one predetermined digit line out of the digit lines, and checking whether there are any "on" state memory cell transistors in which a current flowing in the selected digit line is higher than a reference current for a normal reading operation;

a current setting/holding step for setting, when an "on" state memory cell transistor is detected in the "on" cell detection step, all of the word lines to a second over-erasing judgment reference potential for judgment of over-erasing deeper than the first over-erasing judgment reference potential, checking whether there are any "on" state memory cell transistors in which a current flowing in the selected digit line is higher than the reference current for the normal read operation and, when the "on" state memory cell transistor is detected, setting and holding an "on" cell specifying reference current slightly higher than the current in the selected digit line in place of the reference current for the normal read operation such that the current in the selected digit line is determined to be an "off" cell current with respect to the "on" cell specifying reference current;

an over-erased cell specifying step for setting, subsequent to the current setting/holding step, the selected word line to the first over-erasing judgment reference potential, and setting other word lines than the selected word line to the first over-erasing judgment reference potential and, by skipping the current setting/holding step in the case when it is determined that no "on" state memory cell transistor is present at the time of setting the second over-erasing judgment reference potential, checking whether there are any "on" state memory cell transistors in which a current flowing in the selected digit line is higher than a reference current for specifying the "on" state memory cell transistor; and a shallow writing step for executing shallow writing shallower than the normal writing with respect to the memory cell transistor connected to the selected digit line and also to the selected word line when an "on" state memory cell transistor is detected in the over-erased cell specifying step, the selected word line being switched after the shallow writing step and also when no "on" memory cell transistor is detected in the over-erased cell specifying step such that all of the steps from the over-erased cell specifying step are executed for all of the word lines, and the selected digit line being switched when no "on" memory cell transistor is detected in the "on" cell detection step such that all of the steps from the "on" cell detection step are executed for all of the digit lines.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention will be described with reference to the drawings.

Figure 2:
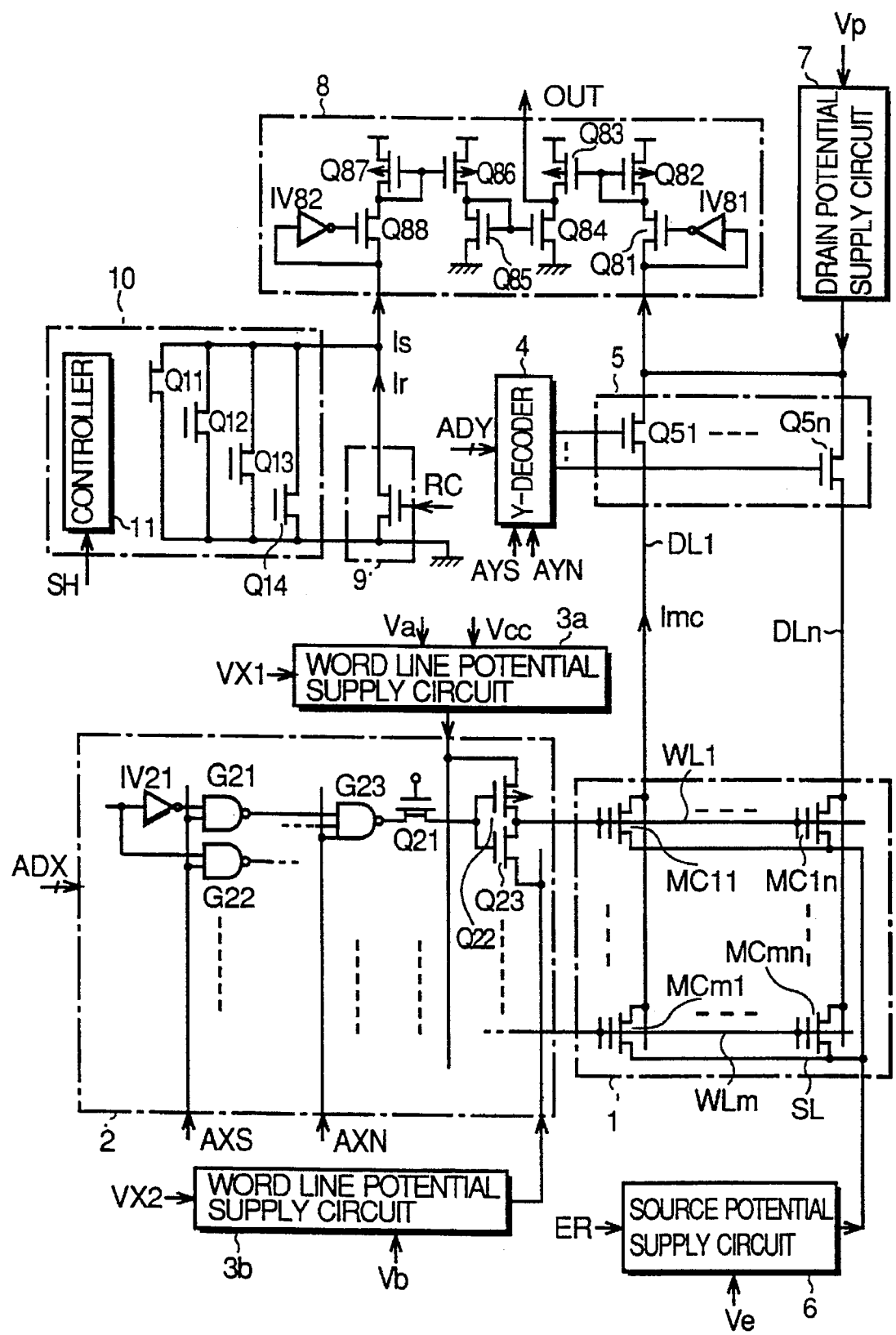
FIG. 2 is a circuit diagram showing a non-volatile semiconductor memory of a first embodiment according to the invention.

FIG. 2 shows, in a schematic view, a first embodiment of the non-volatile semiconductor memory according to the invention.

Figure 1:
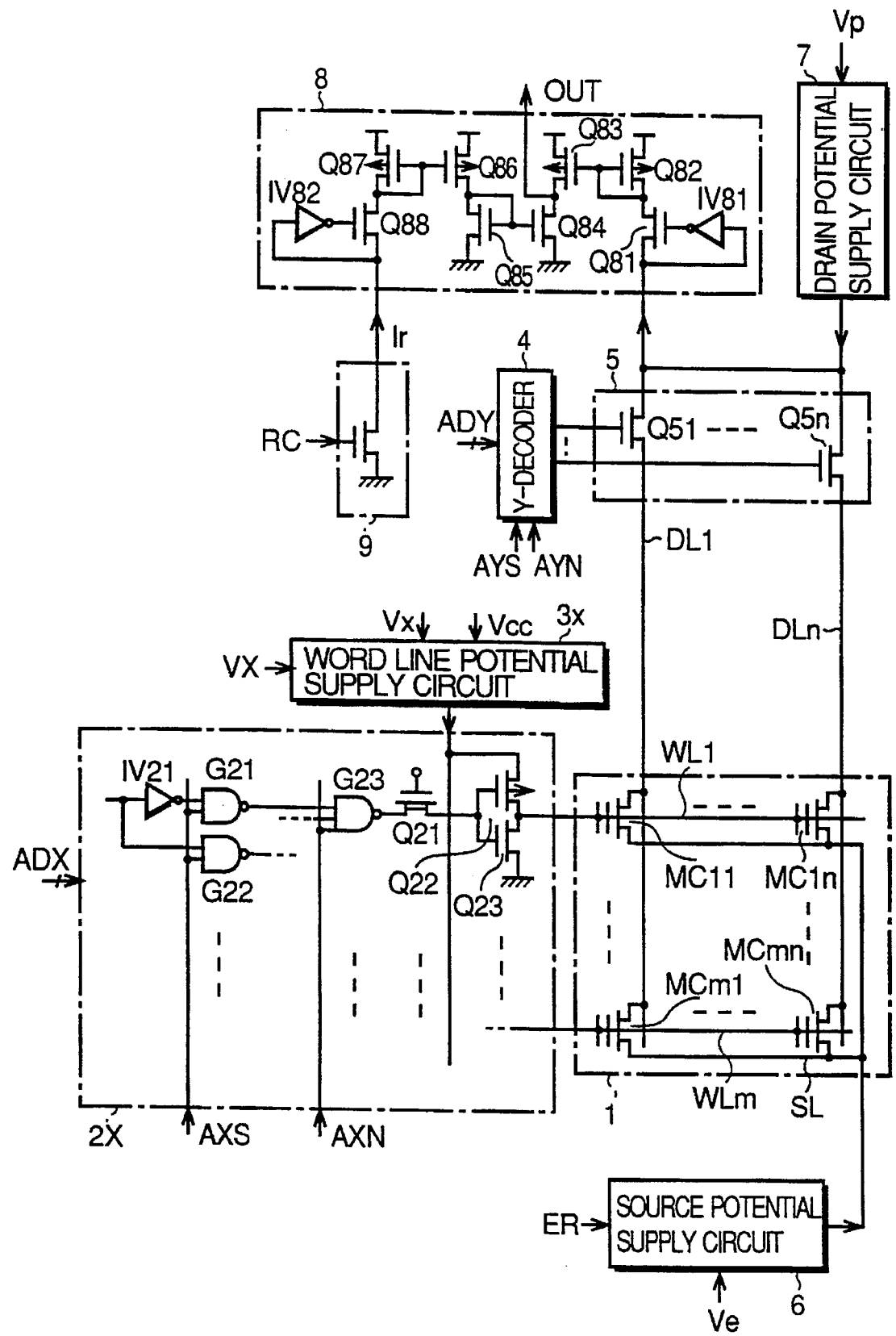
FIG. 1 is a circuit diagram showing a prior art non-volatile semiconductor memory.

This embodiment is different from the prior art non-volatile semiconductor memory shown in FIG. 1 in the provision of an X-decoder 2 and word line potential supply circuits 3a and 3b in place of the X-decoder 2x and word line potential supply circuit 3x in the prior art memory and also in the provision of a current setting/holding circuit 10.

The X-decoder 2 and word line potential supply circuits 3a and 3b, serve together as word line selecting means, which are operable according to control signals AXN, AXS, VX1 and VX2 and an X-address signal ADX to hold all the word lines WL1 to WLm at the ground potential in the flash erasing operation, at a first over-erasing judgment reference potential Va for a predetermined over-erasing judgment in an "on" cell detection operation, and at a second over-erasing judgment reference potential Vb deeper than the first over-erasing judgment reference potential Va in an "on" cell specifying reference current setting operation and, in an "on" cell specifying operation, hold a selected one of the word lines WL1 to WLm at the first over-erasing reference potential Va while holding the non-selected word lines at the second over-erasing judgment reference potential Vb. The current setting/holding circuit 10, including a controller 11, is operable according to a control signal SH to set, in the "on" cell specifying reference current setting operation, reference current Is to the sense amplifier 8 so that the result of judgment in the sense amplifier 8 is the "off" cell state and, in the "on" cell specifying operation, holds the reference current Is supplied to the sense amplifier 8.

The operation of the embodiment will be described in the following. The normal write operation and read operation are the same as in the prior art non-volatile semiconductor memory shown in FIG. 1, so they are not described any further.

Figure 3:
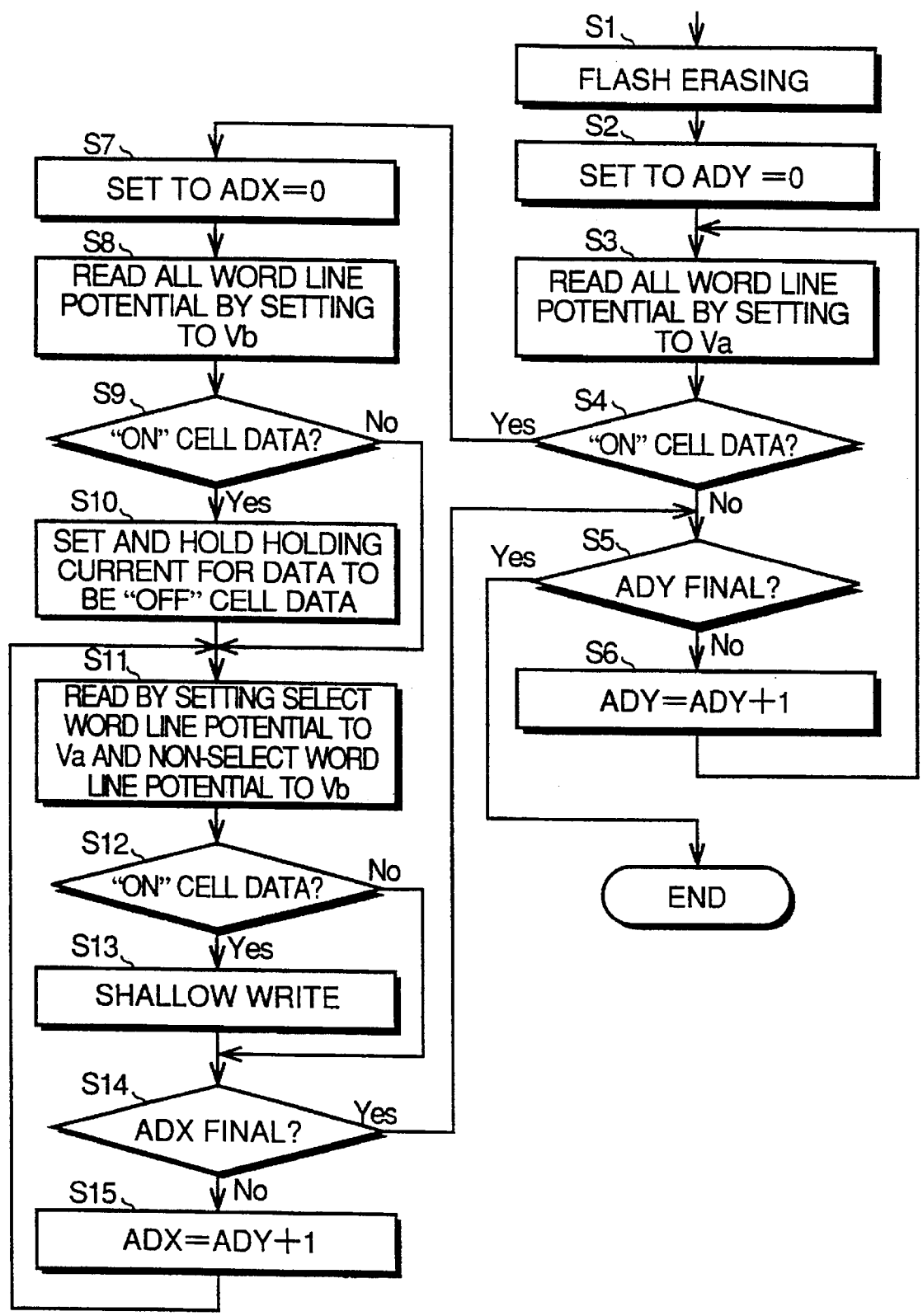
FIG. 3 is a flow chart for describing the operation and a data erasing process in the non-volatile semiconductor memory shown in FIG. 2.

The description of the erasing operation includes the description of a data erasing process in this embodiment. FIG. 3 is a flow chart for describing the data erasing process in this embodiment.

First, the control signal AXN is set to low level to turn on all the transistors Q23, and according to the control signal VX2 the output potential of the word line potential supply circuit 3b is brought to the ground potential in order to bring all the word lines WL1 to WLm to the ground potential. Also, the control signal AYN is set to low level to turn off all the transistors Q51 to Q5n in the Y-selector 5 so as to bring all the digit lines DL1 to DLn to the non-selective state, i.e., the floating state. In this state, according to an erasing control signal ER a predetermined high potential, i.e., erasing potential Ve, is supplied from the source potential supply circuit 6 to the source line SL. Thus, flash erasing is effected. As a result, the threshold voltage of all the memory cell transistors MC11 to MCmn is reduced to be lower than a predetermined reference voltage (i.e., erasing judgment reference potential), resulting in a flash erased state is brought about (step S1 in FIG. 2).

Then, the control signals AYS and AYN are both set to high level, and the address signal ADY is set to an initial value (step S2). Then, one of the digit lines DL1 to DLn (i.e., digit line DL1), is selectively connected to the sense amplifier 8, and the control signals AXS and AXN are set to low and high levels, respectively, to turn on all the transistors Q22. In this state, according to the control signal VX1, the output potential of the word line potential supply circuit 3a is set to the first over-erasing judgment reference potential Va so as to set all the word lines WL1 to WLm to the first over-erasing judgment reference potential Va of the word line potential supply circuit 3a and, according to a control signal RC, the reference current Ir is supplied from the reference current supply circuit 9 to the sense amplifier 8 for the read operation (step S3). The sense amplifier 8 compares the current in the selected digit line DL1 with the reference current Ir and, when the former current is greater than the latter, determines that an "on" cell ("on" cell data), i.e., a memory cell transistor in an over-erased state, is present (step S4).

When it is determined, as a result of the above "on" cell (or over-erased cell) check operation, that an over-erased memory cell transistor is present, the routine goes to a step S7. When it is determined that no over-erased memory cell transistor is present, the selected digit line is switched over to the next digit line to repeat the procedure of the step S3 and following steps.

In the step S7, which is brought about when it is determined that, in the "on" cell (or over-erased cell) check operation, an over-erased memory cell transistor is present, the X-address signal ADX is initialized. Then, the control signal AXN is set to low level to turn on all the transistors Q23 and, according to the control signal VX2, the output potential of the word line potential supply circuit 3b is set to the second over-erasing reference potential Vb to set all the word lines WL1 to WLm to the second over-erasing reference potential Vb. In this state, the reference current Ir is supplied from the reference current supply circuit 9 to the sense amplifier 8 for the erasing operation (step S8). The sense amplifier 8 compares the current in the selected digit line (DL1) with the reference current It. When the current is higher than the reference current Ir, the sense amplifier 8 determines that an "on" cell (i.e., "on" cell data), i.e., an over-erased memory cell transistor, is present with respect to the second over-erasing judgment reference potential. If the current is lower than the reference current Ir, the sense amplifier 8 determines that no "on" cell with respect to the second over-erasing judgment reference potential Vb is present (step S9).

When it is determined that a memory cell transistor in the over-erasing state with respect to the second over-erasing judgment reference voltage Vb is present, the supply of the reference current Ir from the reference current generator 9 to the sense amplifier 8 is discontinued and, instead, a reference current Is from current setting/holding circuit 10 is supplied to the sense amplifier 8, and the transistors Q11 to Q14 in the current setting/holding circuit 10 are on-off controlled while holding all the word lines WL1 to WLm at the second over-erasing judgment reference potential Vb. The reference current Is supplied to the sense amplifier 8 is set to be slightly higher than the current in the selected digit line (DL1), thus setting and holding a current such that the output data of the sense amplifier 8 is "off" cell data (step S10). In this way, an "on" cell specifying reference current is set and held.

Subsequent to this "on" cell specifying reference current setting operation, a step S11 is executed. When it is determined in the step S9 that no "on" cell data (i.e., non "on" cell with respect to the second over-erasing judgment reference potential Vb) is present, the "on" cell specifying reference current setting operation is skipped. In the step S11, while holding the reference current Ir supplied to the sense amplifier 8, the control signals AXS and AXN are both set to high level, set the output potential of the word line potential supply circuit 3a to the first over-erasing judgment reference potential Va according to the control signal VX1 and also set the output potential of the word line potential supply circuit 3b to the second over-erasing judgment reference potential Vb according to the control signal VX2. In this state, one word line (WL1) is selected according to the X-address signal ADX, and the potential on the selected word line (WL1) is set to the first over-erasing judgment reference potential Va, while setting the potential on the non-selected word lines other than the selected word line (WL1) to the second over-erasing judgment reference potential Vb. The read operation is done in this way (step S11).

When the output data of the sense amplifier 8 is "on" cell data (indicating that the current in the selected digit line is higher than the reference currents Ir and Is), it is determined that the memory cell transistor connected to the selected digit line and selected word line have been over-erased. When the sense amplifier output data is "off" cell data, it is determined that the memory cell transistor described above has been normally erased (step S12). At this time, it can be seen that the memory cell transistor that has been determined, through the step S10, to be in the over-erased state is in a deeply over-erased state with its threshold voltage lower than the second over-erasing judgment reference potential Vb, while the memory cell transistor that has been determined, without going via the step S10, to be in the over-erased state is in a shallow over-erased state with its threshold voltage being intermediate between the first and second over-erasing judgment reference potentials Va and Vb.

In the above way, an "on" cell (over-erased cell) specifying operation is done, shallow writing compared to the normal writing is done with respect to a memory cell transistor that has been determined to be in the over-erased state (i.e., "on" or over-erased cell) (step S13). The shallow writing is done by a hot electron injection process or a tunneling current process with at least either one of the selected word and digit line potentials (not shown in FIG. 2) set to be lower than the normal writing potential so as to be able to obtain a smaller memory cell transistor threshold voltage change than obtainable in the normal writing.

After the shallow writing with respect to the over-erased memory cell transistor, or when it is determined in the step S12 that "off" cell data is present, the selected word line is switched (step S15) to repeat the routine from the step S11 with respect to the next word line. When the same routine has been executed with respect to the last address word line (step S14), the routine goes back to the step S5, and the selected digit line is switched (step S6) to repeat the routine from the step S3.

When the routine from the step S3 has been executed repeatedly with respect to all the digit lines, the erasing operation with respect to this non-volatile semiconductor memory is completed.

Figure 4:
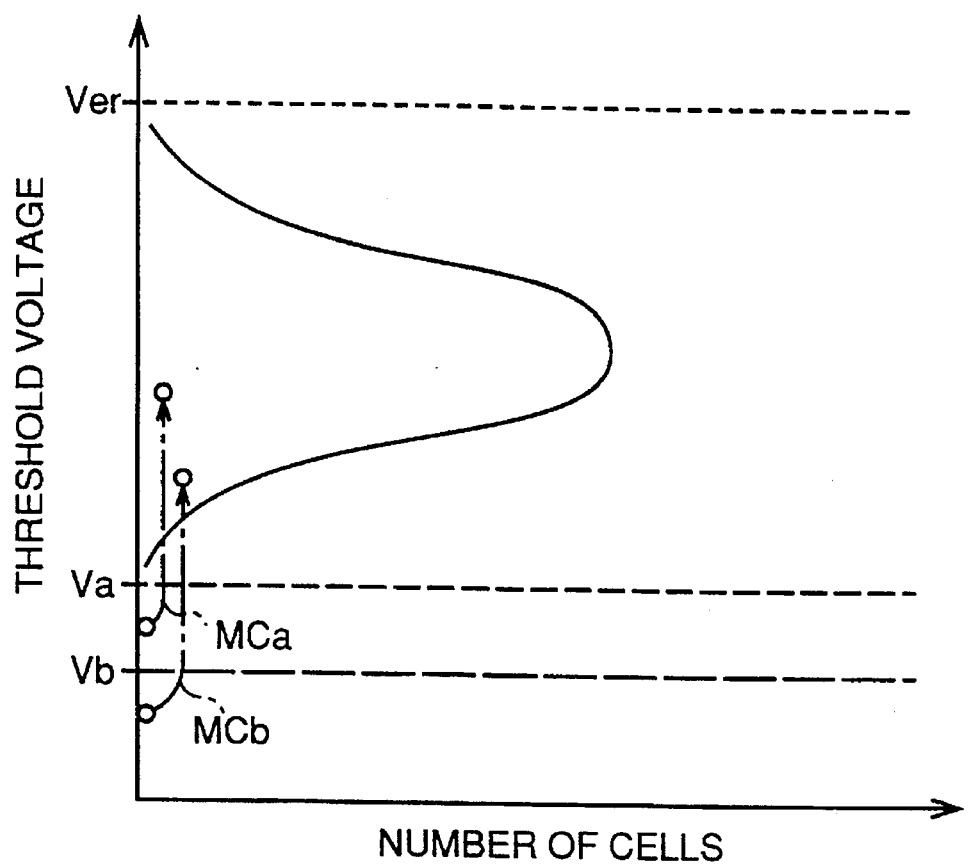
FIG. 4 is a graph showing a threshold voltage distribution for describing the operation and effects of the non-volatile semiconductor memory shown in FIG. 2.
Figure 5:
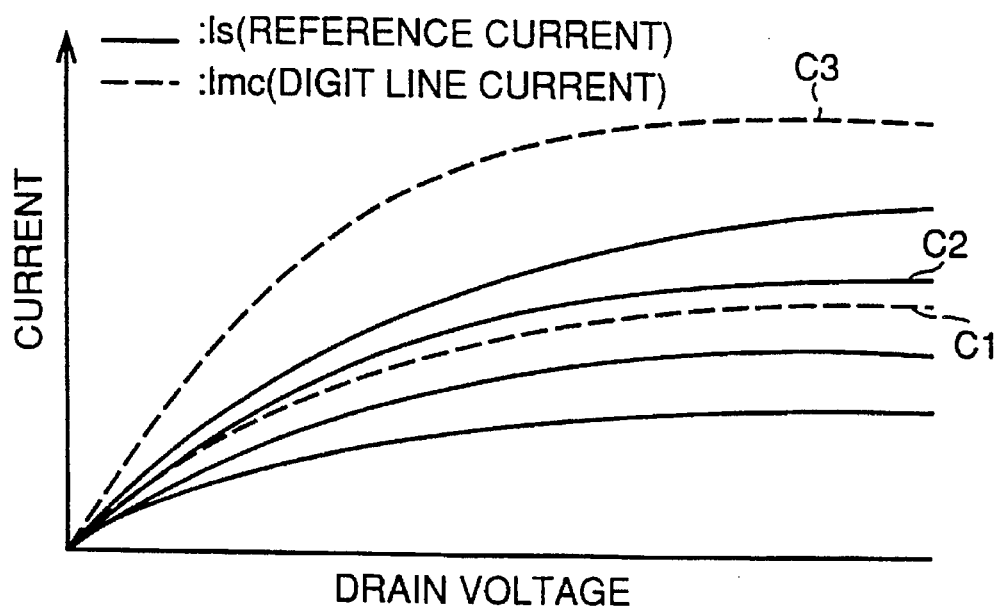
FIG. 5 is a graph comparing a reference current and a digit line current for describing the operation and a data erasing process in the non-volatile semiconductor memory shown in FIG. 2.

FIG. 4 is a graph showing a memory cell transistor threshold distribution characteristic after the flash erasing operation and threshold voltage changes before and after the shallow writing with respect to the over-erased cell in this embodiment. FIG. 5 is a graph comparing the reference current set by the current setting/holding circuit 10 and the digit line current when an over-erased cell is present.

In this embodiment, the distribution of the threshold voltages of the memory cell transistors MC11 to MCmn after the flash erasing operation is as shown by the curve in FIG. 4, it being assumed that over-erased memory cell transistors MCa and MCb are present. Labeled Ver is an erasing judgment reference voltage for judging whether a memory cell transistor is in the erasing state. Labeled Va is the first over-erasing judgment reference potential for the over-erased state judgment as described above. Labeled Vb is the second over-erasing judgment reference potential for the judgment of deeper over-erasing. Labeled MCa is a memory cell transistor, with respect to which comparatively shallow over-erasing has been done. Labeled MCb is a memory cell transistor, with respect to which deeper over-erasing has been done.

In the above description of the erasing operation and the data erasing method, it can be seen through the steps S3 and S4 that the over-erased memory cell transistors MCa and MCb are present among the memory cell transistors connected to the selected digit line, and the presence of the memory cell transistor MCb to which the deeper over-erasing has been performed can be seen through the steps S8 and S9. Curve C1 in FIG. 5 represents the characteristic of the selected digit line current Imc, and curve C2 represents the reference current Is set in the step S10.

When the memory cell transistor MCb in the deeper over-erased state is selected through the steps S11 and S12, the selected digit line current Imc is greatly increased to obtain a characteristic shown by curve C3. When the memory cell transistor MCa in the relatively shallow over-erased state is selected, the selected digit line current Imc, although not increased to up to the level shown by the curve C3, is also increased to be higher than the level C2 of the reference current that is set. When the over-erased memory cell transistor MCa or MCb is selected, the output data of the sense amplifier 8 thus represents "on" cell data. Thus, it is possible to specify the over-erased memory cell transistor.

When it is determined through the steps S3 and S4 that "on" cell data is present while it is determined through the steps S8 and S9 that no "on" cell data is present, the memory cell transistor MCa in the shallow over-erased state is present. In this case, since the reference current Ir remains unchanged, when the word line with this memory cell transistor MCa connected thereto is selected through the steps S11 and S12, the potential on the selected word line becomes the first over-erasing judgment reference potential Va, thereby causing a higher current than the reference current Ir to flow through the selected digit line. Thus, the memory cell transistor MCa can be specified.

The shallow writing is done in the step S13 with respect to the over-erased memory cell transistors MCa and MCb which are specified in the above way. As a result, the threshold voltage of the memory cell transistors MCa and MCb is restored beyond the first over-erasing judgment reference potential Va to the range showing the normally erased state. At this time, the shallow writing causes a smaller threshold voltage change than in the case of the normal writing. Thus, it is not possible to exceed the erasing judgment reference potential Ver, which would result in the non-erased state.

Consequently, all the memory cell transistors MC11 to MCmn are made to have the threshold voltage indicative of the normal erased state. Memory cell transistors, which have not been determined to be in the over-erased state after the flash erasing, are held in that state without shallow writing done with respect to them. Thus, in the read operation, drain current reduction of these memory cell transistors does not occur. It is thus possible to maintain high speed operation, and it is possible to ensure freedom from the generation of non-erased memory cell transistors.

Moreover, since the over-erased memory cell transistors are specified for shallow writing on them, it is not necessary to confirm the erased state again or repeat the flash erasing operation. It is thus possible to reduce time until the normal erased state is reached.

Figure 6:
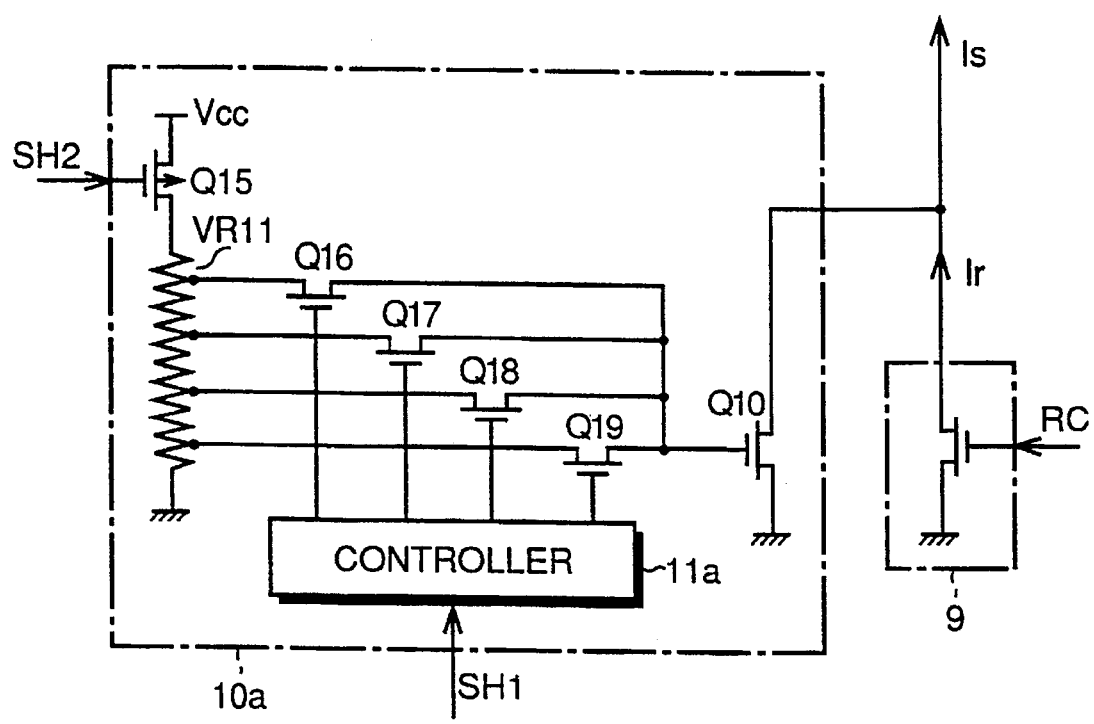
FIG. 6 is a circuit diagram showing a current setting/holding circuit part of a non-volatile semiconductor memory of a second embodiment according to the invention.

FIG. 6 is a circuit diagram showing the current setting/holding circuit in a second embodiment of the non-volatile semiconductor memory according to the invention.

The illustrated current setting/holding circuit 10a of the embodiment, includes a transistor Q15 and a voltage divider VR11 for dividing supply voltage Vcc, a controller 11a and transistors Q16 to Q19 for selecting a plurality of divided voltages from the voltage divider VR11 according to a control signal SH1, and a transistor Q10 for receiving the selected divided voltage at the gate and setting and holding the reference current Is supplied to the sense amplifier 8.

The remainder of the circuit structure is the same as in the first embodiment shown in FIG. 2, and also the operation of various parts, data erasing process and effects are the same as in the first embodiment.

As has been described in the foregoing, according to the invention a check is made, after flash erasing of all the memory cell transistors, with respect to each of the plurality of digit lines as to whether an over-erased memory cell transistor is present, and when it is determined that an over-erased memory cell transistor is present, shallow writing is done with respect to this over-erased memory cell transistor only. Thus, unlike the prior art example in which shallow writing at one time is done upon detection of an over-erased memory cell transistor, memory cell transistor drain current reduction does not occur in the read operation. Quick operation thus can be ensured. In addition, no non-erased memory cell transistor is generated. Moreover, no re-confirmation of the erased state or repeated flash erasing or like operation is necessary, thus permitting corresponding reduction of the time until the normal erased state is reached.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A non-volatile semiconductor memory comprising:

a memory cell array including a plurality of field-effect transistors capable of setting electrical threshold voltage, said field-effect transistors serving as memory cell transistors arranged as memory cells in rows and columns;

a plurality of word lines each provided for each row of said memory cell array and connected to a control gate of each of said memory cell transistors of a corresponding one of the rows;

a plurality of digit lines each provided for each column of said memory cell array and connected to a drain of each of said memory cell transistors of a corresponding one of the columns;

a source line connected to a source of each of said memory cell transistors;

a source potential supply circuit for applying a predetermined erasing voltage to said source line when a flash erasing operation is performed, while holding said source line at ground potential when said flash erasing operation is not taking place;

a word line selecting means and word line potential supply means for setting all the word lines to ground potential in said flash erasing operation, to a predetermined first over-erasing judgment reference potential in an "on" cell detecting operation and to a predetermined second over-erasing judgment reference potential for judgment of over-erasing deeper than the first over-erasing judgment reference potential and in an "on" cell specifying reference current setting operation, in an "on" cell specifying operation, setting a predetermined selected one of said word lines to the first over-erasing judgment reference potential while setting other word lines than the selected word line to the second over-erasing judgment reference potential;

a digit line selecting means for setting all the digit lines to a non-selective floating state in said flash erasing operation and selecting one predetermined digit line out of said digit lines when said flash erasing operation is not taking place;

a sense amplifier for checking whether said memory cell transistors connected to the digit line selected by said digit line selecting means are on or "off" by comparison of a current flowing through the selected digit line with a reference current;

a reference current generator for generating said reference current for a normal read operation and supplying the generated reference current to said sense amplifier in said normal read operation and also in an "on" cell detecting operation;

a current setting/holding circuit for setting said reference current in said "on" cell specifying reference current setting operation such that the result of the check by said sense amplifier is "on", holding said reference current and supplying to said sense amplifier in said "on" cell specifying operation; and a writing means for making shallow writing shallower than a normal writing in memory cell transistors determined to be "on" by said sense amplifier in said "on" on cell specifying operation.

2. The non-volatile semiconductor memory according to claim 1, wherein said current setting/holding circuit includes a plurality of transistors, and sets and holds said reference current by turning on predetermined ones of these transistors and causing a current to flow therethrough.

3. The non-volatile semiconductor memory according to claim 1, wherein said current setting/holding circuit includes at least one transistor, and sets and holds the reference current by adjusting a gate voltage of this transistor and controlling a current that flows through this transistor.

4. A method of erasing data in a non-volatile semiconductor memory comprising a memory cell array including a plurality of field-effect transistors capable of making electrical threshold voltage setting, the field-effect transistors serving as memory cell transistors arranged as memory cells in rows and columns, word lines each provided for each row of said memory cell array and connected to a control gate of each of the corresponding memory cell transistors, digit lines each provided for each column of said memory cell array and connected to a drain of each of the corresponding memory cell transistors, and a source line connected to a source of each of the corresponding memory cell transistors, said method comprising:

a flash erasing step for flash erasing data in all of said the memory cell transistors by supplying a predetermined erasing voltage to said source line while holding all of said word lines at ground potential and holding all of said digit lines in a non-selective state;

an "on" cell detection step for setting all of said word lines to a first over-erasing judgment reference potential for predetermined over-erasing judgment, selecting one predetermined digit line out of said digit lines, and checking whether there are any "on" state memory cell transistors in which a current flowing in the selected digit line is higher than a reference current for a normal reading operation;

a current setting/holding step for setting, when an "on" state memory cell transistor is detected in said "on" cell detection step, all of said word lines to a second over-erasing judgment reference potential for judgment of over-erasing deeper than said first over-erasing judgment reference potential, checking whether there are any "on" state memory cell transistors in which a current flowing in said selected digit line is higher than said reference current for said normal read operation and, when said "on" state memory cell transistor is detected, setting and holding an "on" cell specifying reference current slightly higher than the current in said selected digit line in place of said reference current for said normal read operation such that the current in said selected digit line is determined to be an "off" cell current with respect to said the "on" cell specifying reference current;

an over-erased cell specifying step for setting, subsequent to said current setting/holding step, the selected word line to said first over-erasing judgment reference potential, and setting other word lines than said selected word line to said first over-erasing judgment reference potential and, by skipping said current setting/holding step in the case when it is determined that no "on" state memory cell transistor is present at the time of setting said second over-erasing judgment reference potential, checking whether there are any "on" state memory cell transistors in which a current flowing in said selected digit line is higher than a reference current for specifying said "on" state memory cell transistor; and a shallow writing step for executing shallow writing shallower than the normal writing with respect to the memory cell transistor connected to said selected digit line and also to said selected word line when an "on" state memory cell transistor is detected in said over-erased cell specifying step, said selected word line being switched after said shallow writing step and also when no "on" memory cell transistor is detected in said over-erased cell specifying step such that all of the steps from said over-erased cell specifying step are executed for all of said word lines, and said selected digit line being switched when no "on" memory cell transistor is detected in said "on" cell detection step such that all of the steps from said "on" cell detection step are executed for all of said digit lines.

5. The method of erasing data in a non-volatile semiconductor memory according to claim 4, wherein said shallow writing step is executed through one of a photoelectron injection process and a tunneling current process by setting at least one of potentials on said selected word line and said selected digit line to be different from said normal writing potential so as to be able to obtain a memory cell transistor threshold voltage change less than that in the normal writing.

6. A non-volatile semiconductor memory comprising:

a memory cell array including a plurality of field-effect transistors capable of setting electrical threshold voltage, said field-effect transistors serving as memory cell transistors arranged as memory cells in rows and columns;

a plurality of word lines each provided for each row of said memory cell array and connected to a control gate of each of said memory cell transistors of a corresponding one of the rows;

a plurality of digit lines each provided for each column of said memory cell array and connected to a drain of each of said memory cell transistors of a corresponding one of the columns;

a source line connected to a source of each of said memory cell transistors;

a source potential supply circuit for applying a predetermined erasing voltage to said source line when a flash erasing operation is performed, while holding said source line at ground potential when said flash erasing operation is not taking place;

a word line selecting device and word line potential supply device for setting all the word lines to ground potential in said flash erasing operation, to a predetermined first over-erasing judgment reference potential in an "on" cell detecting operation and to a predetermined second over-erasing judgment reference potential for judgment of over-erasing deeper than the first over-erasing judgment reference potential and in an "on" cell specifying reference current setting operation, in an "on" cell specifying operation, setting a predetermined selected on of said word lines to the first over-erasing judgment reference potential while setting other word lines than the selected word line to the second over-erasing judgment reference potential;

a digit line selecting device for setting all the digit lines to a non-selective floating state in said flash erasing operation and selecting one predetermined digit line out of said digit lines when said flash erasing operation is not taking place;

a sense amplifier for checking whether said memory cell transistors connected to the digit line selected by said digit line selecting device are "on" or "off" by comparison of a current flowing through the selected digit line with a reference current;

a reference current generator for generating said reference current for a normal read operation and supplying the generated reference current to said sense amplifier in said normal read operation and also in an "on" cell detecting operation;

a current setting/holding circuit for setting said reference current in said "on" cell specifying reference current setting operation such that the result of the check by said sense amplifier is "on," holding said reference current and supplying to said sense amplifier in said "on" cell specifying operation; and a writing device for making shallow writing shallower than a normal writing in memory cell transistors determined to be "on" by said sense amplifier in said "on" cell specifying operation.

* * * * *